United States Patent [19]

Bury

[11] 4,419,722
[45] Dec. 6, 1983

[54] LIGHT EMITTING DIODE HOLDER

[76] Inventor: George J. Bury, 25380 Dering La., Lake Villa, Ill. 60046

[21] Appl. No.: 375,912

[22] Filed: May 7, 1982

[51] Int. Cl.³ .............................................. F21V 21/00
[52] U.S. Cl. .................................. 362/396; 362/382; 362/455; 362/800
[58] Field of Search ................ 362/800, 396, 382, 455

[56] References Cited

U.S. PATENT DOCUMENTS 4,195,330  3/1980  Savage ................................. 362/800

Primary Examiner—Stephen J. Lechert, Jr.
Attorney, Agent, or Firm—Thomas W. Buckman; John P. O'Brien; Donald D. Mondul

[57] ABSTRACT

A holder is provided for mounting a light emitting diode (LED) in an aperture in a panel. Relatively short fingers on the holder project through the aperture and engage the opposite side of the panel. Relatively long fingers independent of the short fingers project through the aperture and grip the LED so that the LED can be released from or inserted in the holder with the holder either in mounted or unmounted position.

7 Claims, 7 Drawing Figures

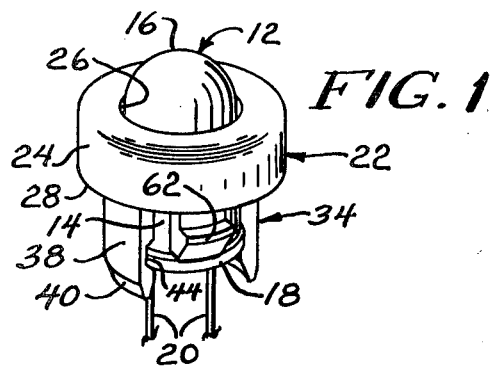
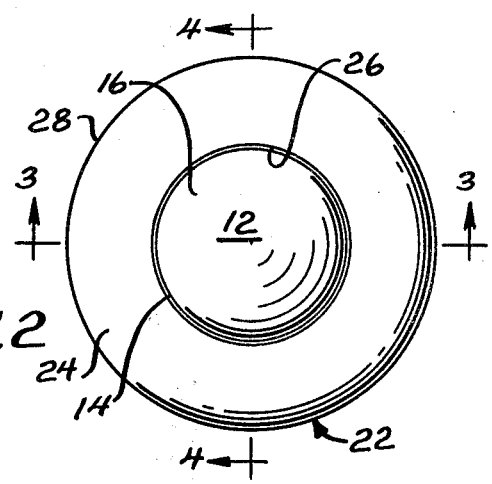
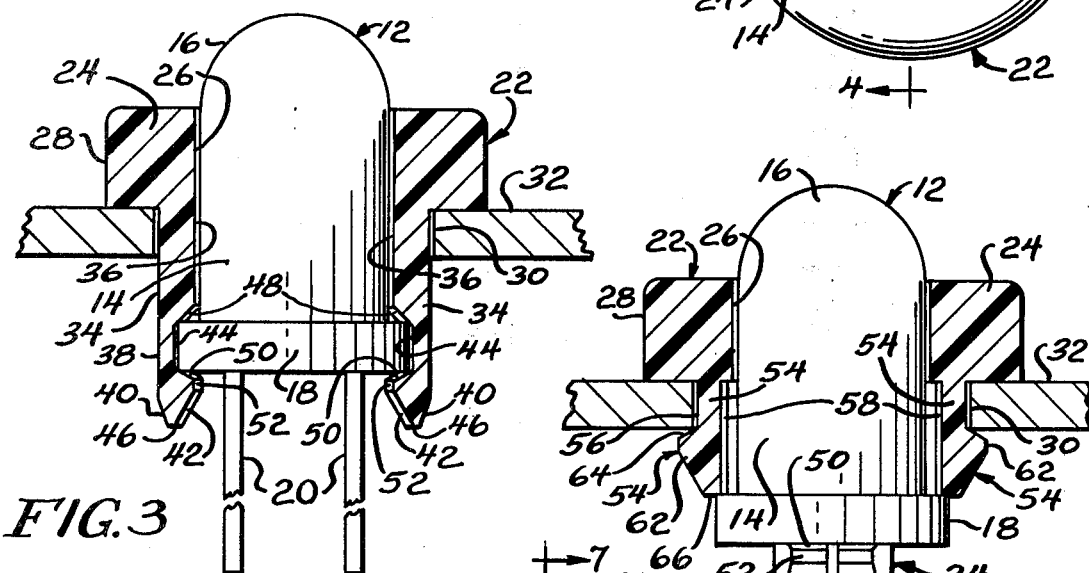
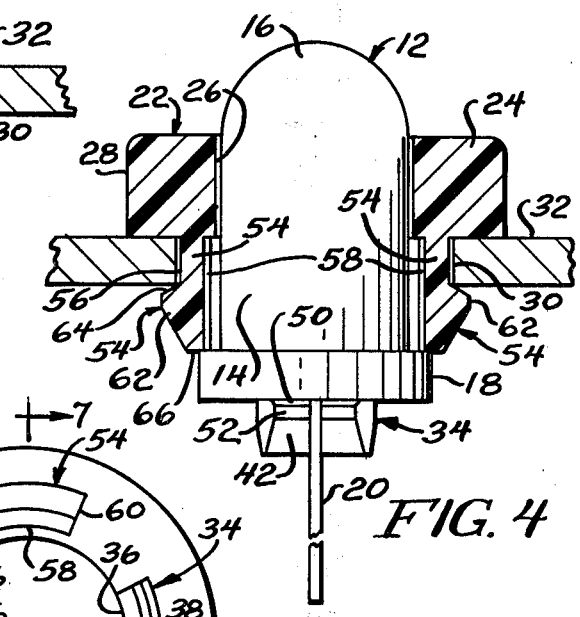
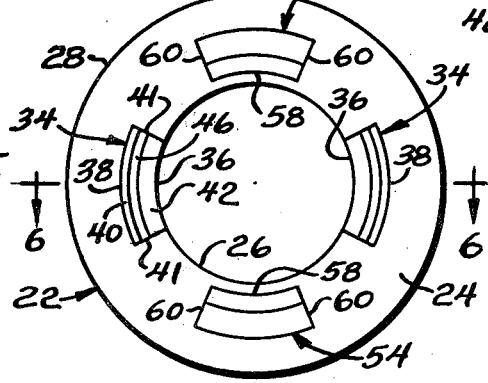
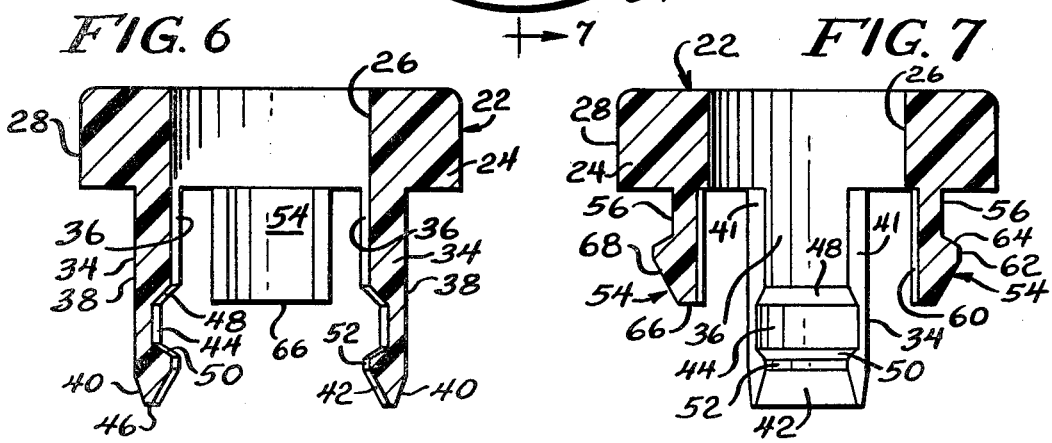
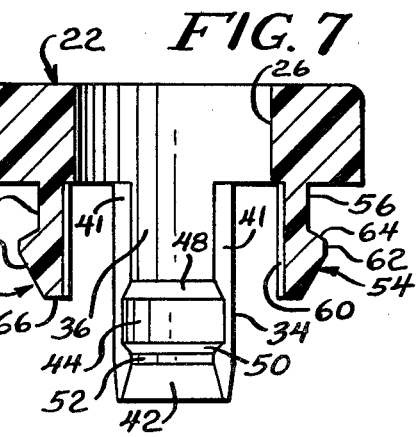

LIGHT EMITTING DIODE HOLDER

BACKGROUND OF THE INVENTION

Light emitting diodes, commonly known as LEDs, are well known in the art, and comprise solid state devices that emit light when a potential is placed across them. Such lights have come into wide range use in calculators, computers, and many diverse devices in which it is desired to know whether a potential is switched on or not. Such devices are vastly superior to previous incandescent light bulbs in that they are inherently rather small in size, require very little power, and are long-lived. Light emitting diodes are commonly housed in glass or other transparent or translucent housings of suitable nature, and have two wires extending therefrom for energization.

In the past it has been known to mount the LEDs in their glass or the like shells in a plastic or other resilient holder which is then snapped into an aperture in a panel. When it is desired to replace an LED it has been necessary to remove the holder from the panel, and then to remove the LED from the holder, the reverse procedure being followed to install a new LED. This is time-consuming and a nuisance. Typically the holder has to be removed from the front of the panel, but the wires for the LED are under the panel, and this requires wires that are otherwise unnecessarily long to permit the holder with the LED therein to be lifted from the panel a far enough distance that the LED can be released from the holder.

OBJECTS AND SUMMARY OF THE PRESENT INVENTION

It is an object of the present invention to provide a light emitting diode holder with which a light emitting diode can be assembled either before or after installation of the holder in an aperture in a panel, and in which the light emitting diode can be removed from the holder either with the holder in place in the aperture in the panel, or removed therefrom.

More particularly, it is an object of the present invention to provide a light emitting diode holder constructed of plastic and with two sets of retainers, one set being disposed immediately adjacent an apertured panel for retention of the holder in an aperture, and the other set being spaced further from the panel to permit flexure thereof for releasably retaining a light emitting diode.

In attaining the foregoing and other objects in accordance with the present invention a plastic molding is provided having a central bore configured to receive a light emitting diode. A flange at one end of the molding limits insertion thereof into an aperture in a panel. There is a pair of resilient arms having snap-over retaining shoulders which engage the panel on the side opposite the flange to secure the molded holder in the aperture. A pair of longer resilient arms having snap-over shoulders thereon receives a flange at the base of the light emitting diode body to secure the light emitting diode in the holder. These latter arms extend sufficiently far from the panel that they are capable of being flexed to admit the light emitting diode after the holder has been installed in the panel as well as before, and to permit withdrawal of the light emitting diode without the necessity of removing the holder from the panel.

THE DRAWINGS

The present invention will best be understood from the following specification when taken in connection with the accompanying drawings, wherein:

FIG. 1 is a perspective view of a light emitting diode holder constructed in accordance with the principles of the present invention and having a light emitting diode mounted therein;

FIG. 2 is a top view of the structure of FIG. 1 on an enlarged scale;

FIG. 3 is an axial sectional view taken along the line 3—3 in FIG. 2;

FIG. 4 is an axial sectional view taken along the line 4—4 in FIG. 2 and at right angles to FIG. 3;

FIG. 5 is an underside view of the holder without the diode mounted therein;

FIG. 6 is an axial sectional view as taken along the line 6—6 in FIG. 5; and

FIG. 7 is an axial sectional view taken along the line 7—7 in FIG. 5, at right angles to FIG. 6.

DETAILED DESCRIPTION OF THE ILLUSTRATIVE EMBODIMENT

With reference to the drawings now in greater particularity, attention first is directed to a light emitting diode 12. It will be understood that this term is used somewhat broadly, since what is actually seen is the outer body or casing of the actual light emitting diode. It includes a cylindrical body 14 having a sherical upper end 16 with a circumferential flange 18 about the lower end which is perpendicular to the axis of the diode 12. As noted previously, the part seen is actually a casing or housing generally made of plastic and cast or molded about the actual diode. The material is translucent or transparent, and may be colored to enhance the color emitted by the internal diode. A pair of metallic wires or leads 20 extend from the base of the structure, the structure hereinafter being referred to simply as a light emitting diode.

The holder 22 forming the subject matter of the present invention is molded of resilient plastic of suitable qualities and color and includes an annular body or ring 24 having an inner diameter 26 just slightly greater than the diameter of the cylindrical body 14 of the LED 12 and adapted to receive such body. The outer diameter 28 of the ring 24 is sufficiently great as to extend beyond an aperture 30 in a plate 32 in which the holder and LED are to be installed.

The holder 22 is provided with a pair of diametrically disposed fingers 34 extending downwardly from the ring 24. Each such finger has an arcuate extent of just under 60° and has an inner diameter 36 lying on the same cylinder as the aperture 36 through the ring 24. Each finger further has an outer diameter 38 of proper dimension to fit through the aperture 30 with some facility, but not so small as to rattle around in the aperture. Each finger further has side walls 41 respectively lying on radii from the center of revolution of the aperture 26 and the respective inner and outer surfaces 36, 38. Each finger 34 at its outer, lower portion has a frustoconical chamfered surface 40 providing a taper facilitating insertion of the fingers through the aperture 30.

Each finger further has an internal chamfered surface 42 facilitating axial insertion of the diode 12 from the bottom of the holder. A circumferential notch 44 is provided internally of each finger 34 spaced upwardly slightly from the lower extremities 46 thereof, such notch being defined by respective upper and lower chamfered surfaces 48 and 50. A cylindrical surface section 52 spaces the internal chamfered surfaces 42 and 50 a short distance.

The LED holder further is provided with a pair of retaining fingers 54 which are substantially shorter than the previously described fingers 34. These fingers are diametrically spaced from one another and are at 90° spacing from the fingers 34, and each is of substantially the same arcuate extent as one of the fingers 34. The retaining fingers 54 have cylindrical section outer surfaces 56 of the same diameter and lying on the same radius as the outer cylindrical surfaces 38 of the fingers 34, thus aiding in positioning the holder in the aperture 30 in the panel 32. The fingers 54 also have arcuate inner surfaces 58 lying on a projected cylindrical surface having a diameter substantially greater than that of the inner surfaces 36 of the fingers 34 and the body of the LED as shown in FIG. 4. The clearance between the LED and the surface 58 is sufficient to enable the finger 34 to flex and snap through the aperture 30 even when the LED has been preassembled with the holder. Radially disposed end walls 60 join the inner and outer walls.

The fingers 54 further have outwardly projecting ribs 62 joined by diagonal shoulders 64 to the surfaces 56 to lock wedgingly under the panel 32. The lower extremities 66 lie on a plane perpendicular to the diameter of the holder 22 about on a level with the top of the notches 44 to aid in positioning the LED. The lower extremities or surfaces 66 are joined to the ribs 62 by chamfered or frustoconical walls 68 to cam the retaining fingers 54 through the aperture 30, and subsequently to spring out wedgingly beneath the panel 32 as shown in particular in FIG. 4.

It will be seen that the fingers 34 for holding the LED in position in the holder 22 are entirely independent of the retaining fingers 54 that retain the holder in an aperture in a panel. The longer fingers 34 are spaced to receive and retain the LED. However, the shorter fingers 54 are spaced farther apart so as to provide a clearance space between these fingers and the LED. This space is of great importance in that it accommodates flexing of the shorter fingers so that the holder can be inserted into (or removed from) the aperture in the panel with the LED in place in the retainer. Furthermore, the various tapered or camming surfaces such as 42 and 50 of the LED-holding fingers facilitate insertion and removal of an LED from the holder regardless of whether the holder is free-standing (prior to insertion in an aperture) or inserted in an aperture in a panel. This materially facilitates assembly and fabrication of apparatus, and also materially facilitates servicing thereof.

The specific example of the invention as herein shown and described is for illustrative purposes only. Various changes in structure will no doubt occur to those skilled in the art, and will be understood as forming a part of the present invention insofar as they fall within the spirit and scope of the appended claims.

The invention is claimed as follows:

1. A holder of the resilient plastic material for mounting to a light emitting device in an aperture in a panel comprising a body having a central channel for receiving said light emitting device, said body being of larger transverse dimensions than said aperture to lie against said panel, a first pair of relatively short fingers on said body in diametrically opposed relation about said channel to extend through said aperture and having outwardly projecting tapered shoulders to wedgingly engage the opposite side of said panel to retain said holder in said aperture, and a second pair of relatively long fingers on said body in diametrically opposed relation to one another and spaced ninety degrees from each of said first pair of fingers about said channel, and means on said second pair of fingers disposed inwardly thereof to retain a light emitting device therein, where each of said relatively long fingers has an inner margin lying on a cylinder of substantially the same diameter as said channel, and each of said relatively short fingers has an inner margin lying on a cylinder of larger diameter than said aperture and hence spaced from a light emitting device held by said relatively long fingers to permit flexing of said relatively short fingers upon insertion of said holder in said panel aperture.

2. A holder as set forth in claim 1 wherein each of said fingers has an arcuate extent no greater than sixty degrees.

3. A holder as set forth in claim 1 wherein said first pair of fingers has tapered, lower outer surfaces to facilitate camming thereof through said aperture.

4. A holder as set forth in claim 1 wherein said means on said second pair of fingers disposed inwardly thereof to retain a light emitting device therein comprises annular recesses therein.

5. A holder as set forth in claim 4 wherein said recesses are provided with internal tapered portions on either side thereof wedgingly to grip a portion of a light emitting device.

6. A holder as set forth in claim 4 and further including internal tapered surfaces at the extremities of said second pair of fingers to permit camming of a light emitting device into place held by said fingers.

7. A holder as set forth in claim 5 wherein the extremities of said first pair of fingers abut a portion of said light emitting device to act with said wedging surfaces to position said light emitting device in said holder.

* * * * *